(12) United States Patent
Marquart

(10) Patent No.: US 8,804,428 B2
(45) Date of Patent: Aug. 12, 2014

(54) DETERMINING SYSTEM LIFETIME CHARACTERISTICS

(75) Inventor: Todd Marquart, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 346 days.

(21) Appl. No.: 13/210,523

(22) Filed: Aug. 16, 2011

(65) Prior Publication Data

US 2013/0044546 A1 Feb. 21, 2013

(51) Int. Cl.
*G11C 16/04* (2006.01)
*G11C 16/06* (2006.01)

(52) U.S. Cl.
USPC .............. 365/185.18; 365/185.12; 365/201

(58) Field of Classification Search
USPC ............................ 365/185.12, 185.18, 201
See application file for complete search history.

(56) References Cited

U.S. PATENT DOCUMENTS

| | | | |
|---|---|---|---|
| 6,894,937 B2 | 5/2005 | Garni et al. | |
| 6,925,018 B2 | 8/2005 | Tatsumi | |
| 7,194,366 B2 | 3/2007 | Singh et al. | |
| 7,327,602 B2 | 2/2008 | Kostylev et al. | |
| 7,463,520 B2 | 12/2008 | Aritome | |
| 7,499,308 B2 | 3/2009 | Chen et al. | |
| 2002/0024846 A1* | 2/2002 | Kawahara et al. | 365/185.24 |
| 2007/0223278 A1* | 9/2007 | Aritome | 365/185.11 |

* cited by examiner

*Primary Examiner* — Tha-O H Bui
(74) *Attorney, Agent, or Firm* — Brooks, Cameron & Huebsch, PLLC

(57) ABSTRACT

The present disclosure includes methods and systems for determining system lifetime characteristics. A number of embodiments include a number of memory devices and a controller coupled to the number of memory devices. The controller can be configured to perform a number of operations on the number of memory devices using a number of trim parameters at a testing level, and determine a system lifetime characteristic based, at least partially, on the number of operations performed on the number of memory devices using the number of trim parameters at the testing level.

32 Claims, 2 Drawing Sheets

DETERMINING SYSTEM LIFETIME CHARACTERISTICS

TECHNICAL FIELD

The present disclosure relates generally to semiconductor memory devices, methods, and systems, and more particularly, to determining system lifetime characteristics.

BACKGROUND

Memory devices are typically provided as internal, semiconductor, integrated circuits and/or external removable devices in computers or other electronic devices. There are many different types of memory including random-access memory (RAM), read only memory (ROM), dynamic random access memory (DRAM), synchronous dynamic random access memory (SDRAM), phase change random access memory (PCRAM), and flash memory, among others.

Flash memory devices can be utilized as volatile and non-volatile memory for a wide range of electronic applications. Flash memory devices typically use a one-transistor memory cell that allows for high memory densities, high reliability, and low power consumption. Uses for flash memory include memory for solid state drives (SSDs), personal computers, personal digital assistants (PDAs), digital cameras, cellular telephones, portable music players (e.g., MP3 players) and movie players, among other electronic devices. Data, such as program code, user data, and/or system data, such as a basic input/output system (BIOS), are typically stored in flash memory devices.

As flash memory devices undergo programming, sensing, and/or erase cycles over the lifetime of a memory system, the accuracy and/or reliability of the cells may decrease, and a failure of the system may eventually occur. For example, after a particular point in the lifetime of the system, programming and/or sensing operations performed on the cells may not be accurate and/or reliable, resulting in an end of the useable life of the system (e.g., a failure of the system).

A number of previous testing approaches have been used to determine (e.g., anticipate and/or predict) the lifetime of a memory system (e.g., the point at which the system may fail). However, many previous approaches may not be able to accurately determine the lifetime of the system, and/or may not be able to do so within a reasonable (e.g., short) testing period.

As an example, short stroking may be used to determine the lifetime of a memory system. In a short stroking approach, the memory of the system may be divided into a number of partitions (e.g., storage units), and one (or more) of the partitions can be tested (e.g., exercised) to determine the lifetime of the tested portion of the system. However, because only a portion of the memory is tested, a short stroking approach may not be able to provide an accurate and/or reliable lifetime determination of the memory system. Additionally, the system may need a significant amount of additional and/or specialized circuitry (e.g., hardware and/or firmware) to perform a short stroking approach, which can increase the cost and/or size of the system, among other drawbacks.

DETAILED DESCRIPTION

Figure 1:
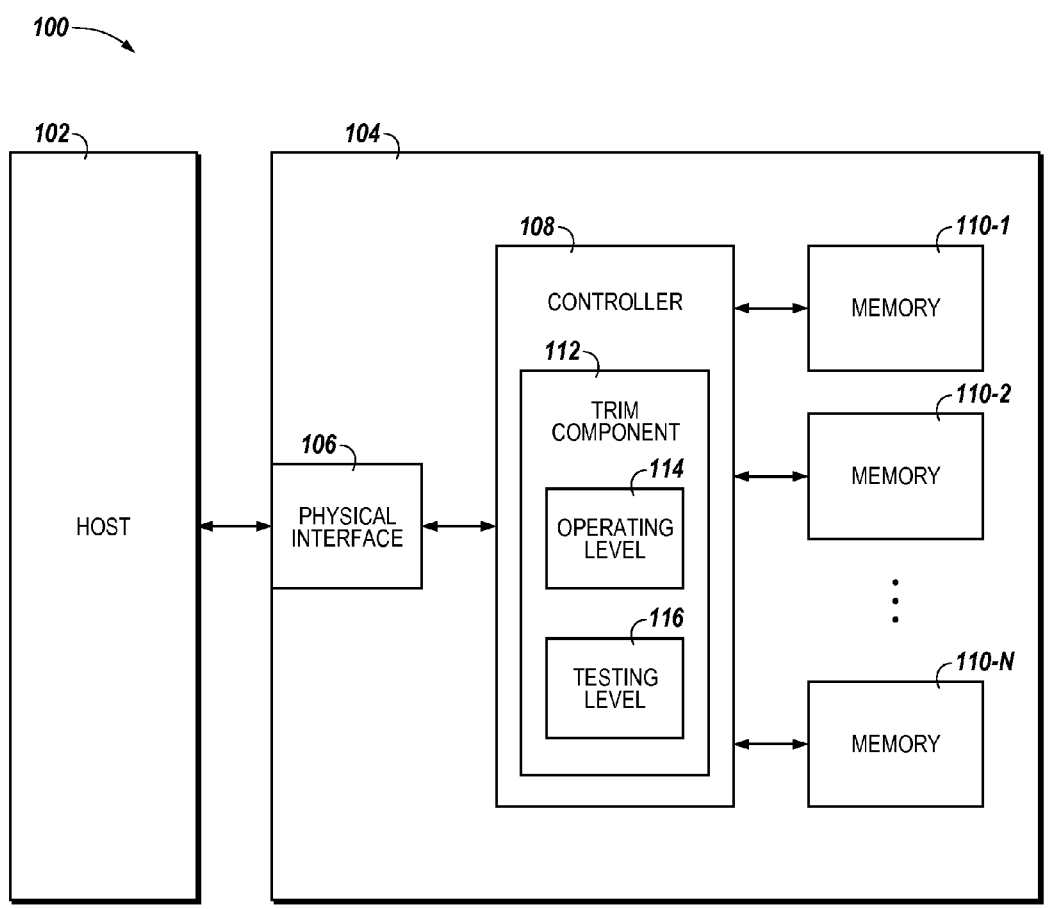
FIG. 1 is a functional block diagram of a computing system including at least one memory system in accordance with a number of embodiments of the present disclosure.

The present disclosure includes methods and systems for determining system lifetime characteristics. A number of embodiments include a number of memory devices, and a controller coupled to the number of memory devices. The controller can be configured to perform a number of operations on the number of memory devices using a number of trim parameters at a testing level, and determine a system lifetime characteristic based, at least partially, on the number of operations performed on the number of memory devices using the number of trim parameters at the testing level.

A number of embodiments of the present disclosure can determine (e.g., anticipate and/or predict) a lifetime characteristic of a system (e.g., a memory system) accurately and/or reliably, and can do so within a relatively short time period as compared to prior approaches. Also, a number of embodiments of the present disclosure can determine a lifetime characteristic of a system without using a significant amount of additional and/or specialized circuitry (e.g., hardware and/or firmware), which can reduce the cost and/or size of the system, among other benefits.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more such things. For example, a number of memory devices can refer to one or more memory devices. Additionally, the designator "N" as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

FIG. 1 is a functional block diagram of a computing system 100 including at least one memory system 104 in accordance with a number of embodiments of the present disclosure. Memory system 104 can be, for example, a solid state drive (SSD). In the embodiment illustrated in FIG. 1, memory system 104 includes a physical host interface 106, a number of memory devices 110-1, 110-2, . . . , 110-N (e.g., solid state memory devices), and a controller 108 (e.g., an SSD controller) coupled to physical host interface 106 and memory arrays 110-1, 110-2, . . . , 110-N.

Physical host interface 106 can be used to communicate information between memory system 104 and another device such as a host 102. Host 102 can include a memory access device (e.g., a processor). One of ordinary skill in the art will appreciate that "a processor" can intend a number of processors, such as a parallel processing system, a number of coprocessors, etc. Example hosts can include laptop computers, personal computers, digital cameras, digital recording and playback devices, mobile telephones, PDAs, memory card readers, interface hubs, and the like.

Physical host interface 106 can be in the form of a standardized physical interface. For example, when memory system 104 is used for information storage in computing system 100, physical host interface 106 can be a serial advanced technology attachment (SATA) physical interface, a peripheral component interconnect express (PCIe) physical interface, or a universal serial bus (USB) physical interface, among other physical connectors and/or interfaces. In general, however, physical host interface 106 can provide an interface for passing control, address, information (e.g., data), and other signals between memory system 104 and a host (e.g., host 102) having compatible receptors for physical host interface 106.

Controller 108 can include, for example, control circuitry and/or firmware. Controller 108 can be included on the same physical device (e.g., the same die) as memory devices 110-1, 110-2, ..., 110-N. For example, controller 108 can be an application specific integrated circuit (ASIC) coupled to a printed circuit board including physical host interface 106 and memory devices 110-1, 110-2, ..., 110-N. Alternatively, controller 108 can be included on a separate physical device that is communicatively coupled to the physical device that includes memory devices 110-1, 110-2, ..., 110-N.

Controller 108 can communicate with memory devices 110-1, 110-2, ..., 110-N to sense (e.g., read), program (e.g., write), and/or erase information, among other operations. Controller 108 can have circuitry that may be a number of integrated circuits and/or discrete components. In a number of embodiments, the circuitry in controller 108 may include control circuitry for controlling access across memory devices 110-1, 110-2, ..., 110-N and/or circuitry for providing a translation layer between host 102 and memory system 104.

Memory devices 110-1, 110-2, ..., 110-N can include, for example, a number of non-volatile memory arrays (e.g., can include a number of non-volatile memory cells). For instance, memory devices 110-1, 110-2, ..., 110-N can be flash devices with a NAND architecture. In a NAND architecture, the control gates of memory cells of a "row" can be coupled with an access (e.g., word) line, while the memory cells can be coupled in series source to drain in a "string" between a select gate source transistor and a select gate drain transistor. The string can be connected to a data (e.g., bit) line by the select gate drain transistor. The use of the terms "row" and "string" implies neither a linear nor an orthogonal arrangement of memory cells. As will be appreciated by those of ordinary skill in the art, the manner of connection of the memory cells to the bit lines and source lines depends on whether the array is a NAND architecture, a NOR architecture, or some other memory array architecture.

The memory arrays of memory devices 110-1, 110-2, ..., 110-N can include a number of memory cells that can be grouped. As used herein, a group can include a number of memory cells, such as a page, block, plane, die, an entire array, or other groups of memory cells. For example, some memory arrays can include a number of pages of memory cells that make up a block of memory cells. A number of blocks can be included in a plane of memory cells. A number of planes of memory cells can be included on a die. As an example, a 128 GB memory device can include 4320 bytes of information per page, 128 pages per block, 2048 blocks per plane, and 16 planes per device.

In the embodiment illustrated in FIG. 1, controller 108 includes a trim component 112. Trim component 112 can provide various trim parameters associated with operating (e.g., programming, erasing, sensing, etc.) memory devices 110-1, 110-2, ..., 110-N. The trim parameters can include, for example, voltage and/or current magnitudes, voltage and/or current pulse durations, and/or particular numbers of voltage and/or current pulses associated with operating memory devices 110-1, 110-2, ..., 110-N. Controller 108 can adjust the particular trim levels (e.g., magnitudes, pulse counts, etc.) provided by trim component 112 and used to operate the memory devices.

In the example illustrated in FIG. 1, trim component 112 includes a number of trim parameters 114 at an operating level and a number of trim parameters 116 at a testing level. The operating level associated with trim parameters 114 can refer to trim levels associated with operating memory devices 110-1, 110-2, ..., 110-N in a manner so as to maximize the lifetime of memory system 104 (e.g., while memory system 104 is in the field). The testing level associated with trim parameters 116 can refer to trim levels associated with testing memory system 104. As such, the trim levels associated with trim parameters 116 can be used to provide accelerated degradation of memory system 104 (e.g., to reduce the lifetime of the system).

As an example, the operating trim levels associated with trim parameters 114 can include a pre-program voltage level, a program verify voltage level, an erase voltage level, an erase verify voltage level, and/or a number of erase pulses associated with performing various operations (e.g., programming, program verify, erase, etc.) on memory devices 110-1, 110-2, ..., 110-N. The testing trim levels associated with trim parameters 116 can include, for instance, a pre-program voltage level, a program verify voltage level, an erase voltage level, an erase verify voltage level, and/or a number of erase pulses associated with performing various operations on memory devices 110-1, 110-2, ..., 110-N (e.g., during testing). As an example, a testing trim level associated with trim parameters 116 can be an erase verify voltage level having a different (e.g., increased) magnitude as compared to an erase verify voltage level associated with trim parameters 114, such that use of the testing erase verify voltage accelerates degradation of memory system 104 as compared to use of the operating erase verify voltage. However, embodiments of the present disclosure are not limited to particular trim parameters, or to particular operating and/or testing trim levels associated with trim parameters 114 and 116, respectively.

In a number of embodiments, memory system 104 can be constructed with trim parameters 116 built into controller 108 (e.g., via hardware and/or firmware). That is, trim parameters 116 can be pre-adjusted trim parameters. Memory system 104 may or may not include operating parameters 114 (e.g., operating parameters 104 may be loaded from somewhere else).

When operating trim levels associated with trim parameters 114 are applied to memory devices 110-1, 110-2, ..., 110-N, the memory devices can be considered tuned memory devices. That is, the operating trim levels associated with trim parameters 114 can be configured (e.g., tuned) so as to result in a low (e.g., minimal) amount of degradation (e.g., stress) of memory cells of memory devices 110-1, 110-2, ..., 110-N during operation (e.g., during programming, sensing, and/or erase operations performed on the memory devices while in the field). Such operating trim parameters 114 can be designed to result in increased (e.g., maximum) performance, accuracy, and/or reliability of memory system 104.

When testing trim levels associated with trim parameters 116 are applied to memory devices 110-1, 110-2, . . . , 110-N, the memory devices can be considered de-tuned memory devices. For instance, the testing trim levels associated with trim parameters 116 can be adjusted (e.g., different) as compared to the operating trim levels associated with corresponding trim parameters 114 so as to result in an accelerated (e.g., greater than minimum) amount of degradation of memory cells of memory devices 110-1, 110-2, . . . , 110-N during testing (e.g., during programming, sensing, and/or erase operations performed on the memory devices using the testing trim levels). As such, application of the testing trim levels associated with trim parameters 116 can accelerate degradation of memory system 104 as compared to application of the operating trim levels associated with trim parameters 114. Using the testing trim levels can accelerate testing of memory system 104.

In a number of embodiments trim parameters 116 can have an acceleration factor associated therewith. The acceleration factor corresponds to accelerated testing of memory devices 110-1, 110-2, . . . , 110-N. The acceleration factor can be, for example, a pre-determined number of program and/or erase cycles performed on memory devices 110-1, 110-2, . . . , 110-N using operating trim levels associated with the trim parameters 114 that is equivalent to a (e.g., a single) program and/or erase cycle performed on memory devices 110-1, 110-2, . . . , 110-N using testing trim levels associated with the trim parameters 116. For example, if it has been pre-determined that one program and/or erase cycle performed on memory devices 110-1, 110-2, . . . , 110-N using the trim levels associated with trim parameters 116 is equivalent to ten program and/or erase cycles performed on memory devices 110-1, 110-2, . . . , 110-N using the trim levels associated with trim parameters 114, the acceleration factor associated with the trim parameters 116 can be ten. The acceleration factor can depend on, for example, the particular trim parameters 116 (e.g., whether the parameter is a program voltage magnitude, an erase verify voltage magnitude, and/or a particular number of erase pulses) and/or the type of memory devices 110-1, 110-2, . . . , 110-N (e.g., whether the memory devices include multilevel cells or single level cells).

In a number of embodiments, controller 108 can determine a system lifetime characteristic associated with memory system 104 based, at least partially, on a number of operations performed on memory devices 110-1, 110-2, . . . , 110-N using the testing trim levels associated with trim parameters 116 and/or an acceleration factor associated therewith. For example, controller 108 can determine the system lifetime characteristic by multiplying the number of operations performed on memory devices 110-1, 110-2, . . . , 110-N using the trim levels associated with trim parameters 116 by the acceleration factor associated with the particular trim parameters 116. That is, the system lifetime characteristic can be the product of the number of operations performed on memory devices 110-1, 110-2, . . . , 110-N using the trim parameters 116 and the acceleration factor associated with the trim parameters 116.

The system lifetime characteristic can, for example, be an anticipated and/or predicted point at which a number of memory devices 110-1, 110-2, . . . , 110-N may fail. For instance, the system lifetime characteristic can be the total number of program and/or erase cycles that can be performed by memory system 104 prior to a determined (e.g., anticipated and/or predicted) system failure (e.g., before a number of memory devices 110-1, 110-2, . . . , 110-N fail), and/or the total amount of data (in bytes, for example) programmable (e.g., writable) to memory devices 110-1, 110-2, . . . , 110-N prior to a determined system failure (e.g., before a number of the memory devices fail). That is, controller 108 can determine a system lifetime characteristic associated with memory system 104 by running memory system 104 (e.g., a number of memory devices 110-1, 110-2, . . . , 110-N) to failure.

In a number of embodiments, controller 108 can determine a system lifetime characteristic associated with memory system 104 without running memory system 104 to failure. For example, controller 108 may perform a number of operations corresponding to an estimated system lifetime characteristic associated with a manufacturing specification corresponding to memory system 104. The estimated lifetime characteristic can be, for example, an estimated number of program and/or erase cycles that can be performed by memory system 104 prior to system failure, and/or an estimated total amount of data (e.g., bytes) programmable to memory devices 110-1, 110-2, . . . , 110-N prior to system failure. For instance, controller 108 may perform a number of operations to a total number of program and/or erase cycles and/or to a total bytes written associated with the specification corresponding to memory system 104.

As an example, if 4,000 program and/or erase cycles are performed on memory devices 110-1, 110-2, . . . , 110-N using testing trim levels associated with the trim parameters 116, and the acceleration factor associated with the trim parameters 116 is ten, the system lifetime characteristic can be determined (e.g., anticipated and/or predicted) to be at least 40,000 program and/or erase cycles. That is, in such an example, controller 108 would determine that at least 40,000 program and/or erase cycles can be performed on memory system 104 prior to system failure.

In a number of embodiments, the determined system lifetime characteristic can be compared to an estimated field lifetime characteristic associated with a manufacturing specification corresponding to memory system 104. If the determined system lifetime characteristic meets or exceeds the estimated field lifetime characteristic associated with the specification, one may assume that memory system 104 can meet or exceed the estimated field lifetime characteristic when in the field. That is, a determination that the system lifetime characteristic meets or exceeds the estimated field lifetime characteristic associated with the specification can be used to validate the estimated field lifetime characteristic. For instance, if the manufacturing specification provides an estimated total bytes written of 72 Terabytes, a determination that the system lifetime characteristic is equal to or greater than 72 Terabytes can be used to validate that memory system 104 meets or exceeds the estimated total bytes written provided by the specification when in the field.

In a number of embodiments, controller 108 can adjust the trim parameters associated with operating memory devices 110-1, 110-2, . . . , 110-N (e.g., between trim levels associated with operating parameters 114 and trim levels associated with testing parameters 116). For example, controller 108 can adjust a pre-program voltage level, program verify voltage level, erase voltage level, erase verify voltage level, and/or a number of erase pulses from an operating level to a testing level. For instance, controller 108 can increase the pre-program voltage level and/or decrease the erase verify voltage level. However, embodiments of the present disclosure are not limited to particular trim parameter adjustments.

As an additional example, once the system lifetime characteristic associated with memory system 104 has been determined, controller 108 can adjust the trim parameters associated with operating memory devices 110-1, 110-2, ..., 110-N from the testing trim levels associated with trim parameters 116 to operating trim levels associated with trim parameters 114. Controller 108 can then perform operations on memory devices 110-1, 110-2, ..., 110-N using the operating trim levels.

In a number of embodiments, controller 108 can determine (e.g., anticipate and/or predict) a system data retention failure rate (e.g., a system data retention capability) based, at least partially, on a number of operations performed on memory devices 110-1, 110-2, ..., 110-N using adjusted trim levels (e.g., testing trim levels) associated with trim parameters 116 and/or an acceleration factor associated therewith. For example, the system data retention failure rate can be determined by multiplying the number of operations performed on memory devices 110-1, 110-2, ..., 110-N by the acceleration factor. The system data retention failure rate can be, for example, a measurement of the ability of the memory cells of memory devices 110-1, 110-2, ..., 110-N to retain data programmed thereto.

In a number of embodiments, controller 108 can determine a system program disturb characteristic and/or a system read disturb characteristic based, at least partially, on the number of operations performed on memory devices 110-1, 110-2, ..., 110-N using testing trim levels associated with trim parameters 116 and/or an additional acceleration factor associated with the testing trim levels. For example, the system program disturb characteristic and/or the system read disturb characteristic can be determined by multiplying the number of operations performed on memory devices 110-1, 110-2, ..., 110-N using the testing trim levels by the acceleration factor. The system read disturb and/or system program disturb characteristics can be, for example, a determined threshold voltage shift of memory cells due to the accumulation of charge, for instance.

Figure 2:
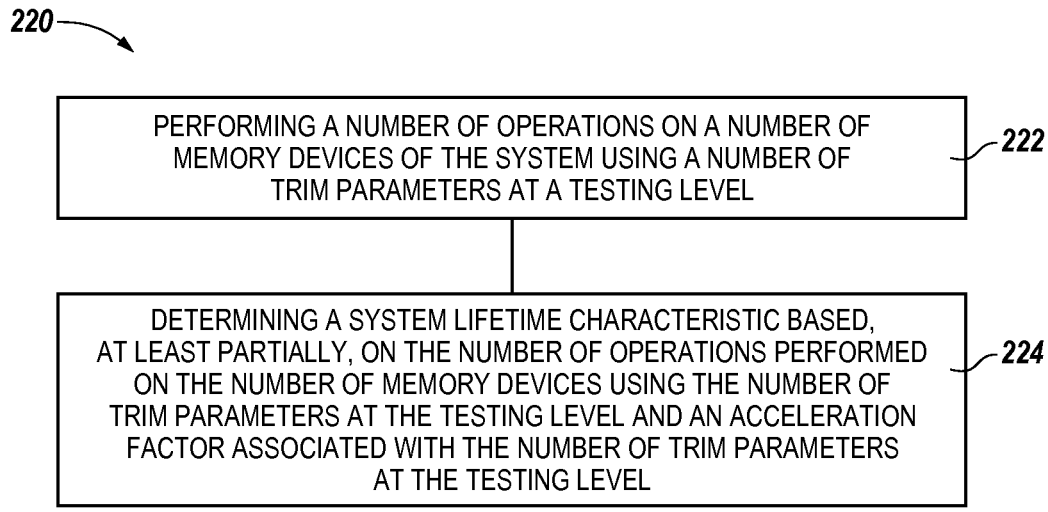
FIG. 2 illustrates a method for determining system lifetime characteristics in accordance with a number of embodiments of the present disclosure.

FIG. 2 illustrates a method 220 for determining (e.g., anticipating and/or predicting) system lifetime characteristics in accordance with a number of embodiments of the present disclosure. The system can be, for example, memory system 104 previously described in connection with FIG. 1. Method 220 can be performed by, for example, controller 108 previously described in connection with FIG. 1.

At block 222, method 220 includes performing a number of operations (e.g., a number of program, sense, and/or erase operations) on a number of memory devices of the system using a number of trim parameters at a testing level. The memory devices can be, for example, memory devices 110-1, 110-2, ..., 110-N previously described in connection with FIG. 1, and the trim parameters can be, for example, trim parameters 116 previously described in connection with FIG. 1. The operations can be performed in a manner analogous to that previously described herein.

At block 224, method 220 includes determining a system lifetime characteristic based, at least partially, on the number of operations performed on the number of memory devices using the number of trim parameters at the testing level and an acceleration factor associated with the number of trim parameters at the testing level. The system lifetime characteristic can be, for example, an anticipated and/or predicted point at which a number of the memory devices may fail, and/or compared to a field lifetime characteristic (e.g., an estimated and/or pre-determined field lifetime characteristic) associated with a specification (e.g., a manufacturing specification) corresponding to the memory system, as previously described herein. The acceleration factor can be, for example, the testing acceleration factor associated with testing levels of the trim parameters 116 previously described in connection with FIG. 1. The system lifetime characteristic can be determined by, for example, multiplying the number of operations performed on the number of memory devices using the number of trim parameters at the testing level by the acceleration factor, as previously described herein.

Figure 3:
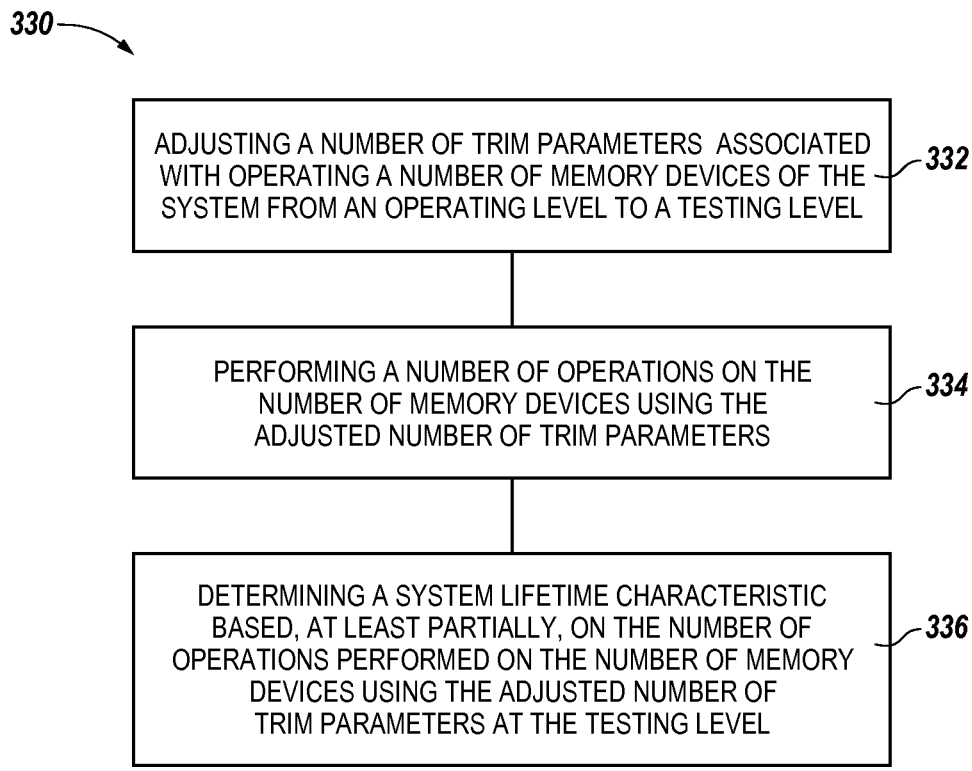
FIG. 3 illustrates a method for determining system lifetime characteristics in accordance with a number of embodiments of the present disclosure.

FIG. 3 illustrates a method 330 for determining system lifetime characteristics in accordance with a number of embodiments of the present disclosure. The system can be, for example, memory system 104 previously described in connection with FIG. 1. Method 330 can be performed by, for example, controller 108 previously described in connection with FIG. 1.

At block 332, method 330 includes adjusting a number of trim parameters associated with operating a number of memory devices of the system from an operating level to a testing level. The memory devices can be, for example, memory devices 110-1, 110-2, ..., 110-N previously described in connection with FIG. 1. The trim parameters at the operating level and the trim parameters at the testing level can correspond to, for example, trim parameters 114 and trim parameters 116, respectively, previously described in connection with FIG. 1.

At block 334, method 330 includes performing a number of operations on the number of memory devices using the adjusted number of trim parameters (e.g., testing trim levels associated with the adjusted trim parameters). The operations can include, for example, program, erase, and/or sense operations, and can be performed in a manner analogous to that previously described herein.

At block 336, method 330 includes determining a system lifetime characteristic based, at least partially, on the number of operations performed on the number of memory devices using the adjusted number of trim parameters at the testing level. The system lifetime characteristic can be, for example, an anticipated and/or predicted point at which a number of the memory devices may fail, and/or compared to a field lifetime characteristic associated with a specification corresponding to the memory system, as previously described herein.

CONCLUSION

The present disclosure includes methods and systems for determining system lifetime characteristics. A number of embodiments include a number of memory devices, and a controller coupled to the number of memory devices. The controller can be configured to perform a number of operations on the number of memory devices using a number of trim parameters at a testing level, and determine a system lifetime characteristic based, at least partially, on the number of operations performed on the number of memory devices using the number of trim parameters at the testing level.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
a number of memory devices; and
a controller coupled to the number of memory devices and configured to:
perform a number of operations on the number of memory devices using a number of trim parameters at a testing level; and
determine a system lifetime characteristic based, at least partially, on the number of operations performed on the number of memory devices using the number of trim parameters at the testing level, wherein the system lifetime characteristic is a total number of program and/or erase cycles that can be performed by the system prior to a determined system failure.

2. The system of claim 1, wherein the number of trim parameters are configured to accelerate degradation of the memory system.

3. The system of claim 1, wherein the controller is configured to determine the system lifetime characteristic based, at least partially, on an acceleration factor associated with the number of trim parameters at the testing level.

4. The system of claim 1, wherein the number of trim parameters at the testing level include a number of program and/or erase parameters at the testing level.

5. A system, comprising:
a number of memory devices; and
a controller coupled to the number of memory devices and configured to:
perform a number of operations on the number of memory devices using a number of trim parameters at a testing level configured to accelerate degradation of the system, wherein the number of trim parameters at the testing level include a pre-program voltage level at the testing level; and
determine a system lifetime characteristic based, at least partially, on the performed number of operations and an acceleration factor associated with the number of trim parameters at the testing level.

6. The system of claim 5, wherein the controller is configured to adjust a number of trim parameters to the testing level from an operating level associated with the number of memory devices.

7. The system of claim 5, wherein the controller is configured to determine the system lifetime characteristic based on multiplication of the performed number of operations by the acceleration factor associated with the number of trim parameters.

8. The system of claim 5, wherein the number of trim parameters at the testing level include an erase verify voltage level having an increased magnitude as compared to an erase verify voltage level at an operating level associated with the number of memory devices.

9. The system of claim 5, wherein the number of trim parameters at the testing level include an increased number of erase pulses as compared to a number of erase pulses corresponding to an operating level associated with the number of memory devices.

10. The system of claim 5, wherein the number of trim parameters at the testing level include an erase voltage level having an increased magnitude as compared to an erase voltage level at an operating level associated with the number of memory devices.

11. The system of claim 5, wherein the number of trim parameters at the testing level include a program verify voltage level different from a program verify voltage level corresponding to an operating level associated with the number of memory devices.

12. A method of testing a system, comprising:
adjusting a number of trim parameters associated with operating a number of memory devices of the system from an operating level to a testing level, wherein adjusting the number of trim parameters associated with operating the number of memory devices includes at least one of:
increasing an erase verify voltage magnitude as compared to an erase verify voltage magnitude associated with the operating level; and
increasing a pre-program voltage magnitude as compared to a pre-program voltage magnitude associated with the operating level;
performing a number of operations on the number of memory devices using the adjusted number of trim parameters; and
determining a system lifetime characteristic based, at least partially, on the number of operations performed on the number of memory devices using the adjusted number of trim parameters at the testing level.

13. The method of claim 12, wherein the method includes comparing the determined system lifetime characteristic to a field lifetime characteristic associated with a specification corresponding to the system.

14. The method of claim 12, wherein determining the system lifetime characteristic includes using an acceleration factor associated with the adjusted number of trim parameters.

15. The method of claim 12, wherein the method includes performing the number of operations on the number of memory devices to a total bytes written associated with a specification corresponding to the system.

16. The method of claim 12, wherein the method includes performing the number of operations on the number of memory devices to a total number of program and/or erase cycles associated with a specification corresponding to the system.

17. A method of testing a system, comprising:
performing a number of operations on a number of memory devices of the system using a number of trim parameters at a testing level;
determining a system lifetime characteristic based, at least partially, on the number of operations performed on the number of memory devices using the number of trim parameters at the testing level and an acceleration factor associated with the number of trim parameters at the testing level; and
determining a system data retention failure rate based, at least partially, on the number of operations performed on the number of memory devices using the number of trim parameters at the testing level and the acceleration factor.

18. The method of claim 17, wherein the method includes performing the number of operations on the number of memory devices to a total number of program and/or erase cycles that can be performed on the number of memory devices prior to a determined system failure.

19. The method of claim 17, wherein the method includes performing the number of operations on the number of memory devices to a total amount of data programmable to the number of memory devices prior to a determined system failure.

20. The method of claim 17, wherein the method includes determining a system program disturb characteristic based, at least partially, on the number of operations performed on the number of memory devices using the number of trim parameters at the testing level and the acceleration factor.

21. The method of claim 17, wherein the method includes determining a system read disturb characteristic based, at least partially, on the number of operations performed on the number of memory devices using the number of trim parameters at the testing level and the acceleration factor.

22. The method of claim 17, wherein the number of trim parameters at the testing level are pre-adjusted.

23. A system, comprising:
a number of memory devices; and
a controller coupled to the number of memory devices and configured to:
adjust a number of trim parameters associated with operating the number of memory devices of the system from an operating level of the system to a testing level configured to accelerate degradation of the system;
perform a number of operations on the number of memory devices using the adjusted number of trim parameters at the testing level; and
determine a system lifetime characteristic based, at least partially, on the performed number of operations and an acceleration factor associated with the adjusted number of trim parameters at the testing level;
wherein:
the number of memory devices are tuned memory devices before the number of trim parameters are adjusted from the operating level to the testing level; and
the number of memory devices are de-tuned memory devices after the number of trim parameters are adjusted from the operating level to the testing level.

24. The system of claim 23, wherein the acceleration factor is a pre-determined number of program and/or erase cycles performed on the number of memory devices using the number of trim parameters at the operating level that is equivalent to a program and/or erase cycle performed on the number of memory devices using the adjusted number of trim parameters at the testing level.

25. The system of claim 23, wherein the acceleration factor corresponds to an accelerated testing of the number of memory devices.

26. A system, comprising:
a number of memory devices; and
a controller coupled to the number of memory devices configured to:
perform a number of operations on the number of memory devices using a number of trim parameters at a testing level, wherein the controller is configured to perform the number of operations on the number of memory devices to a total amount of data programmable to the number of memory devices prior to a determined system failure; and
determine a system data retention failure rate based, at least partially, on the number of operations performed on the number of memory devices using the number of trim parameters at the testing level and an acceleration factor associated with the number of trim parameters at the testing level.

27. The system of claim 26, wherein the controller is configured to determine the system data retention failure rate based on multiplication of the performed number of operations by the acceleration factor associated with the number of trim parameters.

28. The system of claim 26, wherein the system data retention failure rate is a measurement of an ability of memory cells of the number of memory devices to retain data programmed thereto.

29. A system, comprising:
a number of memory devices; and
a controller coupled to the number of memory devices and configured to:
perform a number of operations on the number of memory devices using a number of trim parameters at a testing level; and
determine a system program disturb characteristic and/or a system read disturb characteristic based, at least partially, on the number of operations performed on the number of memory devices using the number of trim parameters at the testing level and an acceleration factor associated with the number of trim parameters at the testing level, wherein the acceleration factor is a pre-determined number of program and/or erase cycles performed on the number of memory devices using the number of trim parameters at an operating level of the system that is equivalent to a program and/or erase cycle performed on the number of memory devices using the number of trim parameters at the testing level.

30. The system of claim 29, wherein the controller is configured to determine the system program disturb characteristic and/or the system read disturb characteristic based on multiplication of the performed number of operations by the acceleration factor associated with the number of trim parameters.

31. The system of claim 29, wherein the system program disturb characteristic and/or the system read disturb characteristic is a threshold voltage shift of memory cells of the number of memory devices.

32. A system, comprising:
a number of memory devices; and
a controller coupled to the number of memory devices and configured to:
perform a number of operations on the number of memory devices using a number of trim parameters at a testing level; and
determine a system lifetime characteristic based, at least partially, on the number of operations performed on the number of memory devices using the number of trim parameters at the testing level, wherein the system lifetime characteristic is a total amount of data programmable to the number of memory devices prior to a determined system failure.

* * * * *